US009453867B2

(12) United States Patent
Dabak et al.

(10) Patent No.: US 9,453,867 B2
(45) Date of Patent: Sep. 27, 2016

(54) PROCESSOR CHIP WITH ULTRASOUND TRANSDUCER FOR ULTRASOUND CHIP DEBUGGING

(71) Applicant: Texas Instruments Incorporated, Dallas, TX (US)

(72) Inventors: Anand Dabak, Plano, TX (US); Clive Bittlestone, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 396 days.

(21) Appl. No.: 14/203,689

(22) Filed: Mar. 11, 2014

(65) Prior Publication Data

US 2015/0262569 A1 Sep. 17, 2015

(51) Int. Cl.

| | |
|---|---|
| ***G01C 3/06*** | (2006.01) |
| ***G01R 31/00*** | (2006.01) |
| ***G06F 11/00*** | (2006.01) |
| ***H04B 11/00*** | (2006.01) |
| *G01S 7/52* | (2006.01) |

(52) U.S. Cl.

CPC ............... *G01R 31/00* (2013.01); *G06F 11/00* (2013.01); *H04B 11/00* (2013.01); *G01S 7/5205* (2013.01)

(58) Field of Classification Search

CPC ....... G01R 31/00; G06F 11/00; H04B 11/00; G10K 11/18; G01S 7/5205

USPC ........................................................ 356/5.01

See application file for complete search history.

(56) References Cited

U.S. PATENT DOCUMENTS

| | | | | |
|---|---|---|---|---|
| 5,517,994 A * | 5/1996 | Burke | B06B 1/0622 600/437 |
| 6,064,420 A | 5/2000 | Harrison et al. | |
| 6,944,794 B2 | 9/2005 | Okabayashi et al. | |
| 2003/0028341 A1* | 2/2003 | Fallon | G01S 7/5205 702/117 |

FOREIGN PATENT DOCUMENTS

EP 1748649 A1 1/2007

OTHER PUBLICATIONS

International Search Report mailed Dec. 10, 2014, for PCT Application No. PCT/US2015/019858 (2 pages).

(Continued)

*Primary Examiner* — Mark Hellner

(74) *Attorney, Agent, or Firm* — John R. Pessetto; Charles A. Brill; Frank D. Cimino

(57) ABSTRACT

A transceiver device combination includes a first ultrasound transducer and a processor chip including a central processing unit (CPU). A memory is coupled to the CPU including stored ultrasound communications software for rendering the processor chip a target device for an ultrasound probe driven via a host computing device having a second ultrasound transducer for together performing ultrasonic debugging of the processor chip. The transceiver device combination includes (i) a transmit path including an ultrasound driver having an input driven by an output of the CPU, where an output of the ultrasound driver is coupled to drive an input of the first ultrasound transducer to transmit ultrasound signals and (ii) a receive path including analog signal processing circuitry that couples an output of the first ultrasound transducer responsive to received ultrasound signals from the ultrasound probe to an input of the CPU.

15 Claims, 4 Drawing Sheets

(56) References Cited

OTHER PUBLICATIONS

Tarig Ballal, et al., "Design and Implementation of an Indoor Ultrasonic Communication System", 22nd IET Irish Signals and Systems Conference (ISSC), Dublin, Ireland, Jun. 23-24, 2011, published on Jun. 22, 2011 by the Institution of Engineering and Technology.

Craig Greenberg, "MCU Debug on a Pin-Count Budget", Texas Instruments, Jan. 25, 2009.

Erdem Ersagun, "Multi-Transducer Ultrasonic Communication", A Thesis Submitted to the Graduate School of Natural and Applied Sciences of Middle East Technical University in Partial Fulfillment of the Requirements for the Degree of Master of Science in Electrical and Electronics Engineering, Feb. 2009.

* cited by examiner

PROCESSOR CHIP WITH ULTRASOUND TRANSDUCER FOR ULTRASOUND CHIP DEBUGGING

FIELD

Disclosed embodiments relate to processor chips such as microcontroller units (MCUs) or digital signal processors (DSPs) including structures and methods for debugging the processor chip to reduce its pin count.

BACKGROUND

MCUs have served the requirements for a broad range of applications for many years. With the advent of lower pin-count offerings, microcontrollers enable embedded processing to become available to a wide variety of applications including automobile electronics to home appliances. However, as the need for more functionality offered by these lower pin-count MCUs increases, the amount of overhead pins needed can become an important factor. Overhead pins can be defined as all pins not directly available for the MCU user for the application, including power supply and ground supplies, dedicated pins for isolation, reset pins, as well as test pins.

For embedded programmable MCU devices, overhead pins typically include all the device pins necessary to interface to the device for software/hardware tools related to debugging and programming the device and its firmware, including support for the in-house testing needs of the semiconductor manufacturer. Traditionally, overhead pins have been dedicated pins at the cost of additional overhead. In one arrangement, some overhead pins can be multiplexed with the existing functional pins of the device. Although pin multiplexing helps reduce the overall pin count, pin multiplexing does not allow for all functional pins to be readily available during debug. Pin multiplexing can therefore make hardware and firmware development challenging.

SUMMARY

Disclosed embodiments recognize known processor chip pin multiplexing can make hardware and firmware development challenging for debugging of the processor chip. As used herein the term "debugging" includes device test and/or emulation operations. Disclosed embodiments include transceiver device combinations including an ultrasound transducer coupled to a processor chip which provide a reduced pin count by having a portion of the processor chip's overhead pins connected by analog front end circuitry to the ultrasound transducer. This arrangement enables wireless ultrasound communications over an ultrasound channel with an ultrasound probe to provide debugging of the processor chip (as well its associated front end analog circuitry). As used herein "overhead pins" are pins not directly available for the MCU user for the application, including power supply and ground supplies, dedicated pins for isolation, reset pins, as well as test pins.

Disclosed embodiments thus utilize an ultrasound communications channel that replaces some of the externally available overhead test pins (e.g., as pins of a package) used for debugging in conventional electrical debugging with internal test pins connected to the ultrasound transducer. Disclosed processor chips can have as little as 6 or 8 pins, such as a 6 or 8 pin microcontroller unit (MCU) or a 16 pin digital signal processor (DSP) including a central processing unit (CPU) chip and associated memory. For devices having an embedded processor, the chip can have as few as 2 pins (power supply pins). Disclosed ultrasound communications software is stored in the memory that the CPU implements for rendering the processor chip and associated front end analog circuitry a target device for an ultrasound probe having a second ultrasound transducer which together perform debugging of the processor chip and associated front end analog circuitry. One or both the front end analog circuitry (ultrasound driver for transmitting and gain amplifier plus filter for receiving) and the ultrasound transducer can optionally be integrated on the processor chip, or be provided together in a single package such as in a stacked die or lateral die arrangement.

BRIEF DESCRIPTION OF THE DRAWINGS

Reference will now be made to the accompanying drawings, which are not necessarily drawn to scale, wherein.

DETAILED DESCRIPTION

Figure 1A:
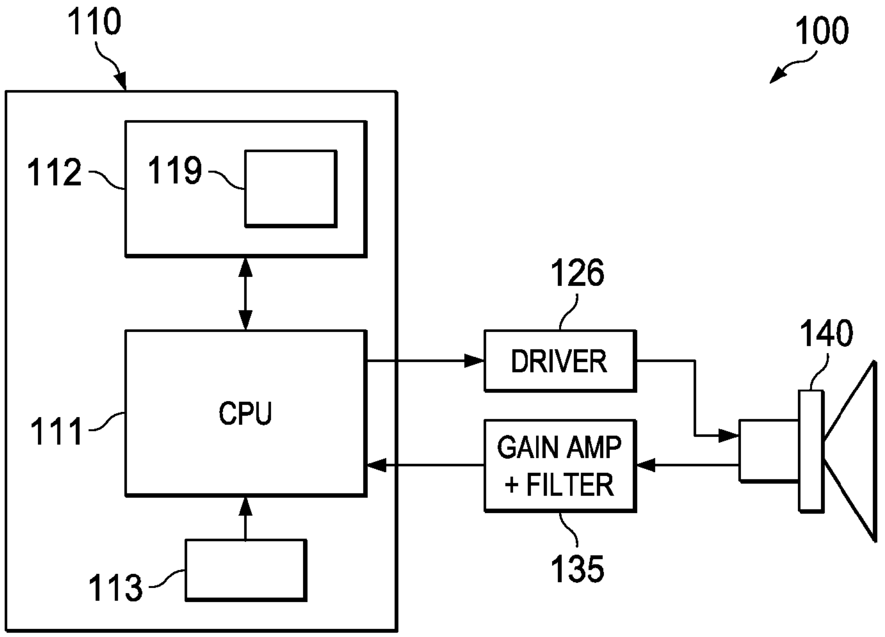
FIG. 1A is a simplified block diagram depiction of an example a transceiver device combination including an ultrasound transducer coupled to a processor chip by analog front end circuitry, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1A is a simplified block diagram depiction of an example ultrasound transceiver device combination (transceiver device combination) 100 including an ultrasound transducer 140 coupled to a processor chip 110 by front end analog circuitry, according to an example embodiment. Processor chip 110 includes a CPU 111 which provides signal processing, at least one memory 112 (e.g., flash memory and/or static RAM (SRAM)) coupled to and accessible by the CPU 111, and a clock 113. Although shown on the processor chip 110, the clock 113 may be an external clock.

The processor chip 110 is configured together with an ultrasound transceiver (hereafter "transceiver") including the front end analog circuitry (ultrasound driver 126 and front end receive analog circuitry 135) interfaced with the ultrasound transducer 140 (referred to as being a "first ultrasound transducer" to be differentiated when described together with an ultrasound probe that has a "second ultrasound transducer") to enable transmitting and receiving modulated ultrasound debug signals on an ultrasound channel that propagates over the air. The transceiver device combination 100 is shown including (i) a transmit path including the ultrasound driver 126 having an input driven by an output of the CPU 111. Although not shown in FIG. 1A, there is a digital-to-analog converter (DAC) between the CPU 111 and the ultrasound driver 126. An output of the ultrasound driver 126 is coupled to drive an input of the ultrasound transducer 140 to transmit modulated ultrasound signals.

The transceiver device combination 100 is shown including a receive path including front end receive analog circuitry 135 including a gain amplifier and a filter that couples an output of the ultrasound transducer 140 responsive to received modulated ultrasound signals from an ultrasound probe having a second ultrasound transducer to an input of the CPU 111. Although not shown in FIG. 1A, there is an analog-to-digital converter (ADC) either within the front end receive analog circuitry 135 or between the front end receive analog circuitry 135 and the input of the CPU 111. Processor chip 110 can comprise a DSP chip or a MCU chip.

Memory 112 includes stored disclosed ultrasound communications software 119. The ultrasound communications software 119 is implemented by the CPU (e.g., when triggered responsive to received ultrasound energy) which is configured for rendering the processor chip 110 and the front end analog circuitry 126, 135 a target device for debugging by an ultrasound probe having a second ultrasound transducer (see ultrasound probe 260 in FIG. 2 having a second ultrasound transducer 290 described below).

Disclosed ultrasound communications software can include code for sequencing disclosed debugging so that as long as the ultrasound channel is operable, the processor chip 110 and its associated front end analog circuitry 126, 135 can go through the same debug sequence that would be used when debug is performed through a conventional electrical communication channel, with a possible slight reduction in data rate. For example, the simplest form of a debug operation is at boot (or some specific software write to a control register). For booting, the processor chip 110 can implement listening on an ultrasound channel in a similar manner to a Joint Test Action Group (JTAG) or other serial command interface. Once booted, the ultrasound data channel can operate without the presence of JTAG or other scan test.

The processor chip 110 can implement waiting for a command for a predetermined period of time, and if no commands are received it can timeout and shut down the ultrasound channel. If the processor chip 110 does receive a command, by implementing ultrasound communications software 119 the processor chip 110 can execute a variety of commands using the ultrasound channel that are now performed by a conventional physical pin connection. Examples of such commands include set/dump registers, read/write to internal or external memory, single step code, calibration, read/write of configuration or trim bits, scan chain access, fuse read/write, setting break points, executing code, triggering self test of logic, memory or analog circuitry, reading/writing device security information, and control of peripherals. In another mode there can be implemented a wakeup function when the ultrasound channel is sleeping and the processor chip wakes up when it receives a burst of ultrasound energy, an it then moves to the listen mode waiting for a command.

The ultrasound transducer 140 (and second ultrasound transducer 290 described below) can comprise a piezoelectric micromachined ultrasound transducer (PMUT), a conventional piezoelectric transducer such as comprising lead zirconate titanate (PZT). In another embodiment the ultrasound transducer can comprise a capacitive micromachined ultrasonic transducer (CMUT).

Ultrasound is known to be an oscillating sound pressure wave with a frequency greater than the upper limit of the human hearing range, being approximately at least 20 kHz. Disclosed ultrasound debug communications generally operate with frequencies from 20 kHz up to several GHz and recognize advantages of ultrasound communications including good security due to a high attenuation (relative to RF) versus distance after a distance of few meters or more. At short wavelengths/high frequency (e.g., ≥1 GHz), one can use multiple input multiple output (MIMO) techniques for increasing the data throughput, where a 8 mm wavelength at 40 kHz of ultrasound is equivalent in data rate to an RF wavelength of 35 GHz.

The transceiver device combination 100 can use a frequency band from $f_1$ kHz to $f_2$ kHz which generally depends on the bandwidth provided by the ultrasound transducer. For an off-the-shelf low cost piezoelectric (e.g. lead zirconate titanate (PZT)) transducer, $f_1$=20 kHz, $f_2$=50 kHz, which allows a data rate of about 10 to 15 kbps using Binary Phase Shift Keying (BPSK)/Quadrature Phase Shift Keying (QPSK) modulation, and a somewhat lower data rate with Frequency-shift Keying (FSK) modulation. For an off-the-shelf higher frequency piezoelectric transducer, such as providing $f_1$=60 kHz and $f_2$=100 kHz, a data rate of about 40 kbps is provided using QPSK, and a somewhat lower data rate with FSK modulation.

Figure 1B:
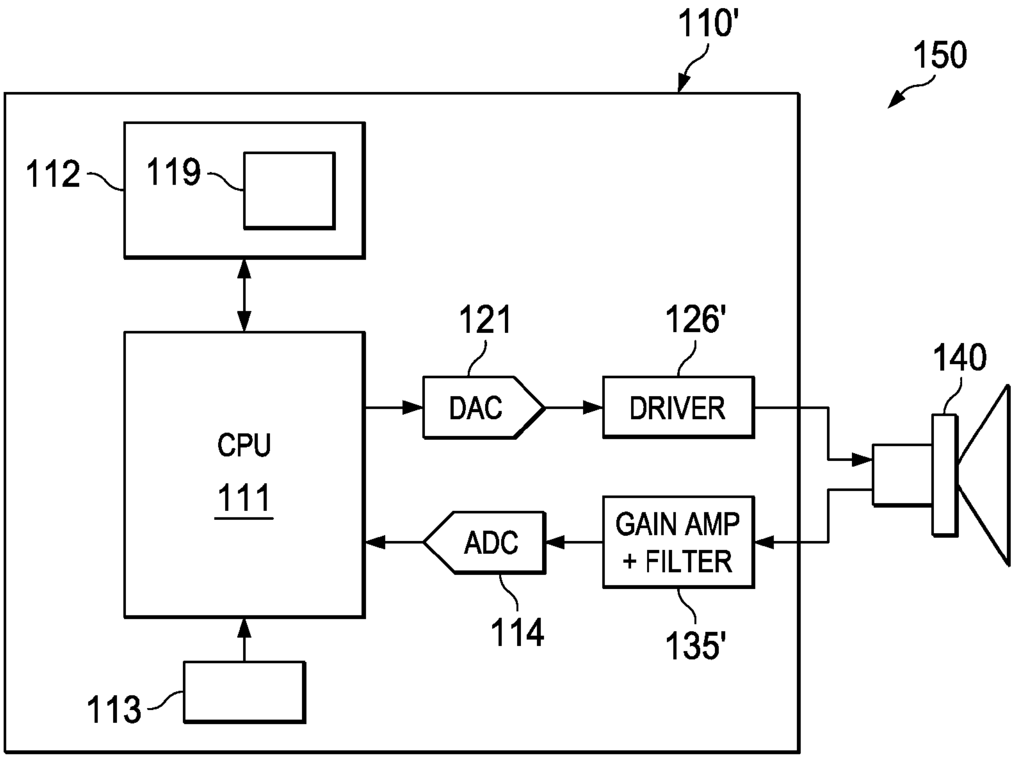
FIG. 1B is a block diagram depiction of an example transceiver device combination including an on-chip analog front end including a gain amplifier and filter on the receive side, and an ultrasound transducer driver on the transmit side, according to an example embodiment.
Figure 1C:
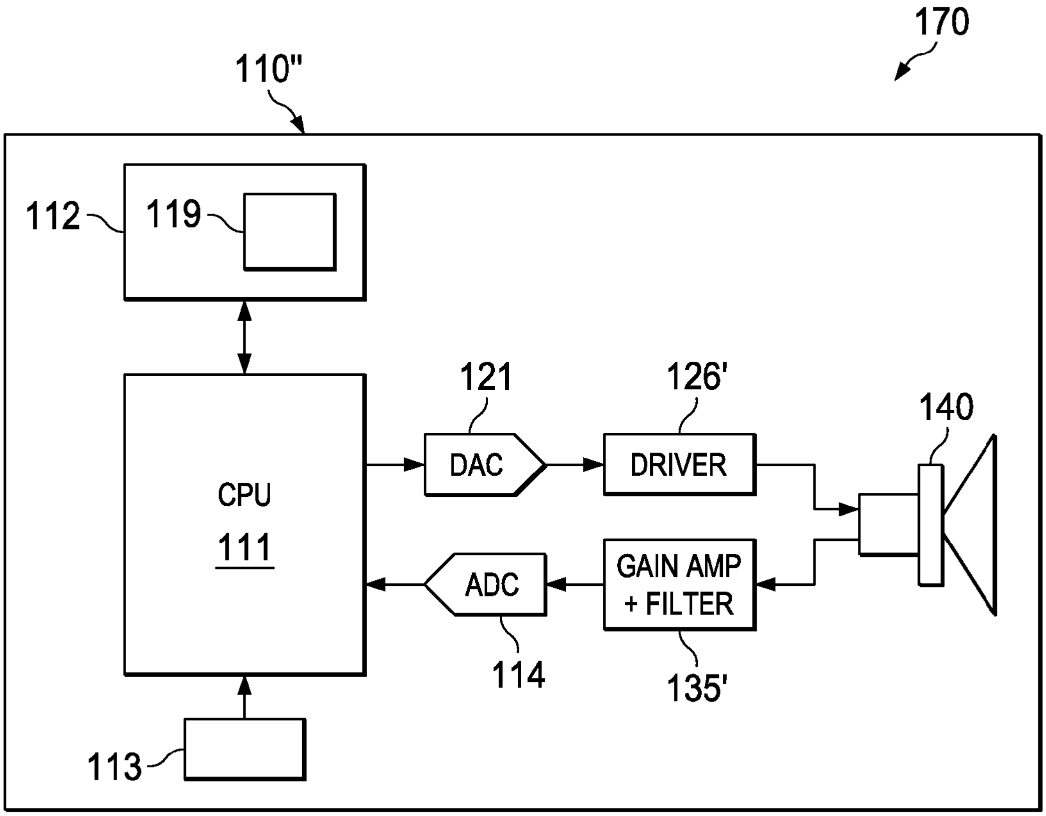
FIG. 1C is a block diagram depiction of the transceiver device combination shown in FIG. 1B modified to include an on-chip ultrasound transducer, according to an example embodiment.

FIG. 1B is a block diagram depiction of an example transceiver device combination 150 being the transceiver device combination 100 shown in FIG. 1A modified to include the ultrasound driver now shown as driver 126' and analog signal processing circuitry (shown including a gain amplifier and a filter) now shown as 135' on a processor chip 110', according to an example embodiment. There is an ADC 114 shown between the front end receive analog circuitry 135 and the input of the CPU 111. FIG. 1C is a block diagram depiction of an example transceiver device combination 170 being the transceiver device combination 150 shown in FIG. 1B modified to include the ultrasound transducer as an on-chip ultrasound transducer now shown as 140' to provide chip 110'', according to an example embodiment.

Figure 2:
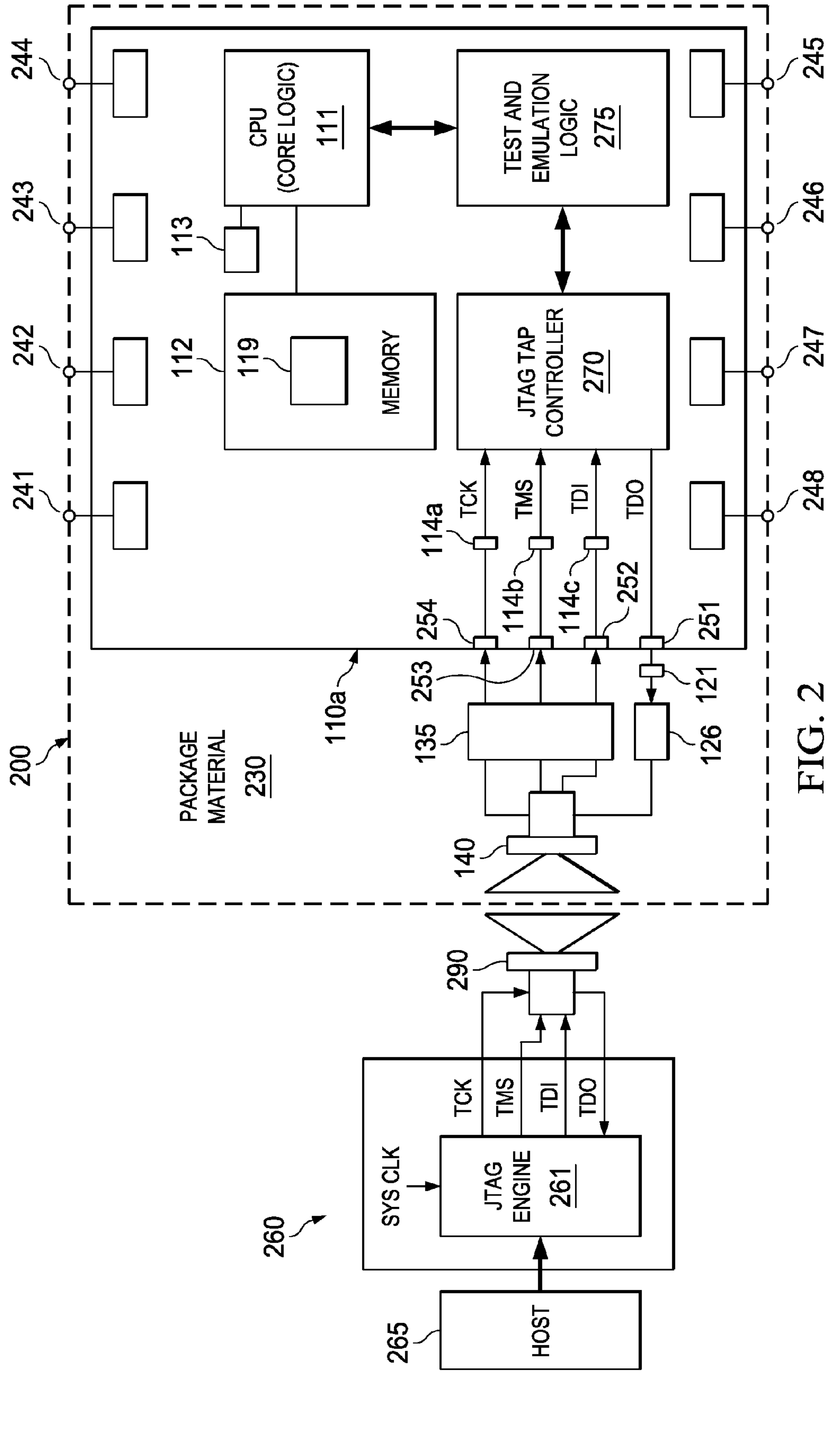
FIG. 2 shows a depiction of an example processor chip and front end analog circuitry debug environment for ultrasound-based debugging of the processor chip and analog front end circuitry of a disclosed transceiver device combination, according to an example embodiment.

FIG. 2 shows a depiction of an example processor chip 110*a* and front end analog circuitry debug environment for ultrasound-based debugging of the processor chip and analog front end circuitry of a disclosed transceiver device combination being the transceiver device combination 100 shown in FIG. 1A modified to now be shown as packaged transceiver device combination 200 including processor chip 110*a*, according to an example embodiment. Processor chip 110*a* is shown having eight (8) external pins 241-248 that are connected to respective bond pads on the chip which are coupled to the outside of the package material (e.g., epoxy) 230. Although not shown connected, external pins 241-248 can be coupled to nodes of packaged transceiver device combination 200 to provide power supply, ground, isolation, clock and certain data.

Processor chip 110*a* includes a plurality of internal bond pads 251-254 which are shown internally coupled to ultrasound transducer 140 to enable ultrasound communications instead of being conventionally coupled outside of the package material 230 to reduce the pin count of the processor chip 110*a* to the 8 external pins (241-248) shown. In this embodiment, the ultrasound transducer 140 can be stacked on the (in the same package) as the processor chip 110*a* to decrease their spacing to enable ultrasound communication-based debugging of the processor chip 110*a* and its associated front end analog circuitry.

The ultrasound probe 260 is shown as a JTAG engine 261 that is driven via a host computing device 265 (host 265), such as a personal computer (PC). Software on the host 265 is configured to translate the desired debug operation into a sequence of commands, for example a sequence of the JTAG commands. The IEEE 1149.1 specification outlines a four- or five-wire interface, commonly referred to as the JTAG interface, or JTAG. Disclosed embodiments are not limited to JTAG communications. Other command specifications including Spy-By-Wire which is a two wire interface provided by Texas Instruments Incorporated to program the flash memory of a microcontroller, or other similar interfaces.

The JTAG interface uses a minimum of four interconnects shown as TMS, TCK, TDI, and TDO. The heart of the JTAG interface is a simple state machine shown within processor chip 110*a* as being a Test Access Port (TAP) controller 270 which is coupled to test and emulation logic 275. Each state of the TAP controller 270 is reached via a sequence of TMS levels for each rising transition of the clock signal, TCK. Depending upon the sequence, the TAP controller 270 will enter a particular mode of operation, such as reading data into the data register or the instruction register.

The JTAG engine 261 is configured to convert these commands and send them onto the JTAG interface signals. The host 265 along with the ultrasound probe 260 coupled to the ultrasound transducer 290 by its own front end analog circuitry (not shown) can initiate ultrasound communications to processor chip 110*a* and its associated analog front end circuitry through communications to packaged transceiver device combination 200. The associated front end analog circuitry is shown in FIG. 2 as DAC 121 and ultrasound driver 126 on the transmit side, and front end receive analog circuitry 135 (e.g., a gain amplifier and a filter) and on-chip ADCs 114*a*, 114*b* and 114*c* on the receive side. Therefore, the ultrasound probe 260 behaves as the master in a master-slave system, with the target device being the processor chip 110*a* and its associated analog front end circuitry acting as the slave.

For example, processor chip 110*a* can comprise a MCU such as the Texas Instruments' MSP430 or MSP 432 MCU which has used a standard JTAG interface as its primary development tool interface since the devices were first introduced. The JTAG interface can be used to interface to MSP430 and MSP432 development tools, and also for device test purposes.

Disclosed embodiments include security operations such as factory key programming implemented by an ultrasound probe, such as the ultrasound probe 260 shown in FIG. 2. Factory key programming is another specific way of using the ultrasound data channel, which adds chip security so that one would need special equipment to read, write or clear the chip's security information (or identification number). With the chip security set, one cannot access the security information from the pins of the chip alone. Moreover, there can be a high security mode where once set the device security code cannot be read or modified from the chip's pins or the ultrasound channel. The high security mode can make reading or modifying data only available for use internal to the chip.

Figure 3:
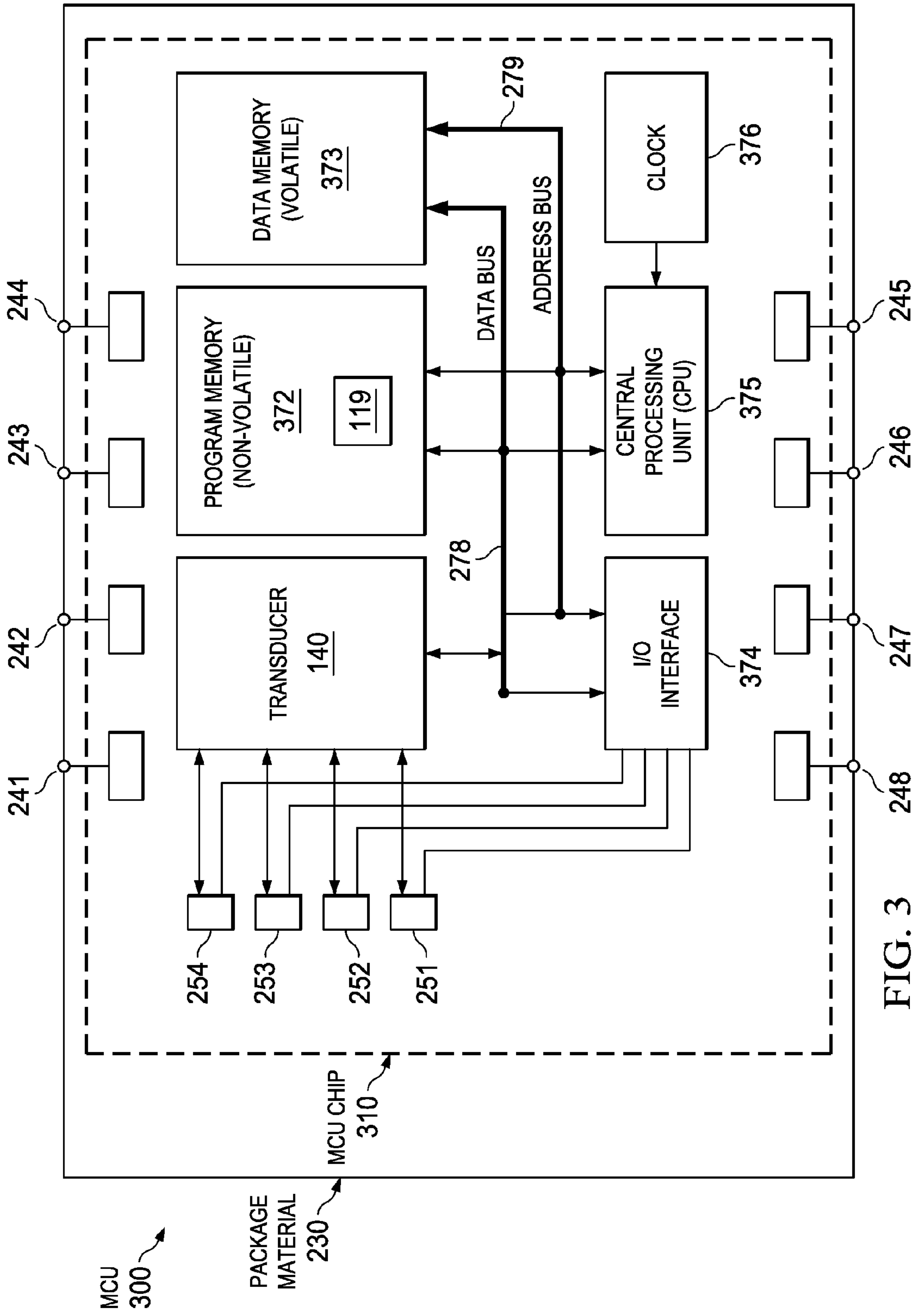
FIG. 3 shows a block diagram depiction of an example 8 pin packaged MCU device having disclosed ultrasound communications software including an MCU chip having an ultrasound transducer stacked on the MCU chip all within package material, according to an example embodiment.

FIG. 3 shows a block diagram depiction of an example 8 pin packaged MCU device 300 having disclosed ultrasound communications software shown including MCU chip 310 having an ultrasound transducer 140 stacked on MCU chip 310 all within package material 230, according to an example embodiment. Clips (not shown) may be used for the stacking. Alternative, the ultrasound transducer can be a transducer chip including through-substrate vias (e.g., through-silicon vias or TSVs) that may be used for the stacking, such as a capacitive micromachined ultrasonic transducer (CMUT). Being in a stacked arrangement, the MCU chip 310 is generally within a few millimeters of the ultrasound transducer 140. MCU chip 310 is shown having external pins 241-248 that connected to respective bond pads on the chip which are coupled outside of the package material 230 for availability to the user. As noted above, external pins 241-248 can include power supply, ground, isolation and data pins.

Bond pads 251-254 of MCU chip 310 are shown as internally coupled bond pads for internally coupling to the ultrasound transducer 140 by the I/O interface 374 (corresponding to the analog front end circuitry described above) shown to enable ultrasound communications instead of being conventionally coupled outside of the package material 230 for electrical connection thereto to reduce the pin count to the 8 external pins shown. As noted above, the ultrasound transducer 140 can be stacked in the same package as the MCU chip 310 to decrease their spacing to enable ultrasound communication-based debugging of the processor chip 110*a* and the I/O interface 374 (corresponding to the analog front end circuitry).

MCU chip 310 is shown including a non-volatile program memory 372, a volatile data memory 373, an I/O interface 374 which provides an ultrasound driver and analog signal processing circuitry (e.g., gain amplifier and a filter), central processing unit (CPU) 375, and clock 376. MCU chip 310 is also shown including a digital data bus 278 and an address bus 279. Disclosed ultrasound communications software 119 is shown in non-volatile program memory 372.

Disclosed embodiments include disabling the transceiver of the device combination after ultrasound testing which can eliminate loading on the internal nodes of the processor chip that were coupled to the transceiver. In this embodiment, the transceiver generally remains in the package. Methods of disabling the transceiver include writing to an internal register, setting a disable ultrasound bit in memory, blowing an internal fuse or electronic fuse (efuse) to disable the transceiver and/or removing power from it. This can be an instantaneous action or deferred to some other event such as next power up. Moreover, disabling of the transceiver can be permanent in some scenarios or reversible in other scenarios.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A transceiver device combination, comprising:
a first ultrasound transducer, and
a processor chip including:
a central processing unit (CPU);
a memory coupled to said CPU, said memory including stored ultrasound communications software that is accessible by said CPU configured for rendering said processor chip a target device for an ultrasound probe driven via a host computing device having a second ultrasound transducer for together performing ultrasonic debugging of at least said processor chip,
wherein said transceiver device combination includes:
(i) a transmit path including an ultrasound driver having an input driven by an output of said CPU, wherein an output of said ultrasound driver is coupled to drive an input of said first ultrasound transducer to transmit ultrasound signals and
(ii) a receive path including analog signal processing circuitry that couples an output of said first ultrasound transducer responsive to received ultrasound signals from said ultrasound probe to an input of said CPU.

2. The transceiver device combination of claim 1, wherein said first ultrasound transducer comprises a separate ultrasound transducer chip that is stacked on said processor chip.

3. The transceiver device combination of claim 2, wherein said separate ultrasound transducer chip comprises a piezoelectric transducer.

4. The transceiver device combination of claim 1, wherein said first ultrasound transducer is integrated on said processor chip.

5. The transceiver device combination of claim 4, wherein said first ultrasound transducer comprises a capacitive micromachined ultrasonic transducer (CMUT) chip.

6. The transceiver device combination of claim 1, wherein said processor chip comprises a first set of bond pads and a second set of bond pads, wherein said second set of bond pads are coupled to said first ultrasound transducer, further comprising a package comprising a packaging material around said processor chip and said first ultrasound transducer, said package having a plurality of pins coupled to said first set of bond pads but not to said second set of bond pads.

7. The transceiver device combination of claim 1, wherein said processor chip comprises a microcontroller unit (MCU) chip.

8. The transceiver device combination of claim 1, wherein said ultrasonic debugging provided by said ultrasound communications software implements:
said first ultrasound transducer receiving an ultrasound debug signal over an ultrasound channel from said second ultrasound transducer, wherein responsive to said ultrasound debug signal said processor chip generates electrical test data;
said first ultrasound transducer converting said electrical test data to transmit an ultrasound test data signal over said ultrasound channel to said second ultrasound transducer of said ultrasound probe.

9. The transceiver device combination of claim 8, wherein said ultrasound communications software further implements disabling said transmit path and said receive path of said transceiver device combination after completing said ultrasonic debugging.

10. A method of ultrasonic debugging, comprising:
transmitting an ultrasound debug signal over an ultrasound channel from a second ultrasound transducer of an ultrasound probe driven via a host computing device;
receiving said ultrasound debug signal by a first ultrasound transducer coupled by analog front end circuitry to a processor chip, wherein responsive to said ultrasound debug signal said processor chip generates electrical test data;
said first ultrasound transducer converting said electrical test data to transmit an ultrasound test data signal over said ultrasound channel, and
said second ultrasound transducer of said ultrasound probe receiving said ultrasound test data signal and converting said ultrasound test data signal to an electrical test data signal, wherein said host computing device evaluates said electrical test data signal.

11. The method of claim 10, further comprising said ultrasound probe implementing factory key programming of said processor chip over said ultrasound channel.

12. The method of claim 10, wherein said processor chip comprises a microcontroller unit (MCU) chip.

13. The method of claim 10, wherein said processor chip comprises a first set of bond pads and a second set of bond pads, wherein said second set of bond pads are coupled to said first ultrasound transducer, further comprising a package comprising a packaging material around said processor chip and said first ultrasound transducer, said package having a plurality of pins coupled to said first set of bond pads but not to said second set of bond pads.

14. The method of claim 10, further comprising disabling a transceiver of an ultrasound device combination providing a receive path and a transmit path including said first ultrasound transducer after completing said ultrasonic debugging.

15. The method of claim 14, wherein said disabling comprises writing to an internal register of said processor chip, setting a disable ultrasound bit in a memory of said processor chip, blowing an internal fuse or electronic fuse (efuse) to disable said transceiver, or removing power from said transceiver.

* * * * *